United States Patent [19]

Kagami

[11] Patent Number: 5,295,099
[45] Date of Patent: Mar. 15, 1994

[54] DYNAMIC RANDOM ACCESS MEMORY DEVICE HAVING STATIC COLUMN MODE OF OPERATION WITHOUT DESTRUCTION OF DATA BIT

[75] Inventor: Akihiko Kagami, Tokyo, Japan

[73] Assignee: NEC Corporation, Tokyo, Japan

[21] Appl. No.: 957,057

[22] Filed: Oct. 6, 1992

Related U.S. Application Data

[63] Continuation of Ser. No. 658,896, Feb. 22, 1991, abandoned.

[30] Foreign Application Priority Data

Mar. 2, 1990 [JP] Japan .................................. 2-50892

[51] Int. Cl.⁵ .............................................. G11C 11/40
[52] U.S. Cl. .................................. 365/189.06; 365/190; 365/203; 365/207; 365/208; 365/229; 365/238.5; 307/530
[58] Field of Search ............... 345/189.06, 203, 207, 345/208, 206, 190, 289, 235, 238.5; 307/530

[56] References Cited

U.S. PATENT DOCUMENTS 4,161,040 7/1979 Satoh .............................. 365/189.06

Primary Examiner—Joseph E. Clawson, Jr.
Attorney, Agent, or Firm—Sughrue, Mion, Zinn, Macpeak & Seas

[57] ABSTRACT

A dynamic random access memory device comprises memory cells arranged in rows and columns and storing data bits, respectively, bit line pairs respectively coupled to every two columns of the memory cells for propagating the data bits read out from the memory cells, word lines respectively coupled to the rows of the memory cells and allowing the data bits stored in one of the rows of the memory cells to be read out to the bit line pairs, sense amplifier circuits provided in association with the bit line pairs and selectively coupling the component bit lines to first and second sources of voltage level depending upon the logic level of the data bits, a pair of data signal lines coupled to an output data buffer circuit, a column selector unit coupled between the bit line pairs and the data signal lines and sequentially interconnecting the bit line pairs and the data signal lines in a static column mode of operation, and a precharging unit coupled to the data signal lines and having current paths from the first source of voltage level to the data signal lines, wherein a limiter is coupled between the first source of voltage level and the data signal lines and prohibits the data signal lines from undesirable low voltage level so that any data bits on the bit line pairs are never destroyed.

5 Claims, 7 Drawing Sheets

DYNAMIC RANDOM ACCESS MEMORY DEVICE HAVING STATIC COLUMN MODE OF OPERATION WITHOUT DESTRUCTION OF DATA BIT

This is a continuation of application Ser. No. 07/658,896 filed Feb. 22, 1991 now aband.

FIELD OF THE INVENTION

This invention relates to a dynamic random access memory device having a static column mode of operation and, more particularly, to a precharging circuit coupled to input-and-output data signal lines incorporated in the dynamic random access memory device.

DESCRIPTION OF THE RELATED ART

A typical example of the dynamic random access memory device is illustrated in FIG. 1 of the drawings, and comprises a memory cell array 1 having a plurality of memory cells M11, M12, M1i, M1n, Mm1, Mm2, Mmi and Mmn. The memory cell array 1 is associated with bit line pairs BLP1 to BLPn, and each of the bit line pairs BLP1 to BLPn is constituted by two bit lines BLa and BLb. The bit lines BLa and BLb are respectively provided for the columns of the memory cells M11 to Mmn, and each of the memory cells M11 to Mmn is implemented by a series combination of a switching transistor SW and a storage capacitor CP coupled between the associated bit line BLa or BLb and a ground node. The switching transistors SW are of the n-channel type. Though not shown in FIG. 1, precharging circuits are coupled to the bit line pairs BLP1 to BLPn and precharge the bit line pairs to an intermediate voltage level Vdd/2 between the power voltage level Vdd and the ground voltage level.

The memory cell array 1 is further associated with a plurality of word lines WL1, WL2, WLj and WLm, and the switching transistors SW of the rows are respectively coupled at the gate electrodes thereof to the word lines WL1 to WLm. Though not shown in FIG. 1, a row address decoder unit is responsive to a row address signal and selectively drives the word lines WL1 to WLm.

The bit line pairs BLP1 to BLPn are respectively coupled to sense amplifier circuits SA1 to SAn, and each of the sense amplifier circuits SA1 to SAn comprises two series combinations of p-channel type field effect transistors Qp1 and Qp2 and n-channel type field effect transistors Qn1 and Qn2 coupled in parallel between two activation signal lines ACT1 and ACT2. A coupled of sense nodes N1 and N2 are provided between the p-channel type field effect transistors Qp1 and Qp2 and the n-channel type field effect transistors Qn1 and Qn2, respectively, and the sense nodes N1 and N2 are coupled to not only the bit lines BLa and BLb of the associated bit line pair but also the gate electrodes of the field effect transistors Qp2 and Qn2, and Qp1 and Qn1. The activation signal lines ACT1 and ACT2 are respectively coupled through a p-channel type field effect transistor Qp3 and an n-channel type field effect transistor Qn3 to a source of power voltage level Vdd and the ground node, and the p-channel type field effect transistor Qp3 and the n-channel type field effect transistor Qn3 concurrently turn on and off with activation signals SEP and SEN. The activation signals SEP and SEN are complementarily shifted between high and low voltage levels. When the p-channel type field effect transistors Qp3 and the n-channel type field effect transistor Qn3 turn on, the power voltage level Vdd and the ground voltage level are supplied to the activation signal lines ACT1 and ACT2, and the sense amplifier circuits SA1 to SAn concurrently start the difference amplifications.

The bit line pairs BLP1 to BLPn are further coupled to a column selector unit 2 consisting of gate transistors Qt1, Qt2, Qti and Qtn, and the gate transistors Qt1 to Qtn are of the n-channel type. A column address decoder unit (not shown) is responsive to a column address signal, and one of the column selecting signals YS1 to YSn is driven to the active high level. Namely, a pair of the gate transistors Qt1 to Qtn turn on in the presence of the column selecting signal YS1 or YSn of the active high level and allow the associated bit line pair to a pair of input-and-output data signal lines D1 and D2. The input-and-output data signal lines D1 and D2 are coupled to an input-and-output data buffer unit 3, and the input-and-output data buffer unit 3 drives an input-and-output data terminal 4.

A precharging circuit 5 is associated with the input-and-output data signal lines D1 and D2, and comprises a series combination of switching transistors CH1 and CH2 coupled between the input-and-output data signal lines D1 and D2, a pair of charging transistors CH3 and CH4 respectively coupled to the input-and-output data signal lines D1 and D2, a charging transistor CH5 coupled between the source of power voltage level Vdd and the intermediate node of the switching transistors CH1 and CH2, and a balancing transistor EQ coupled between the input-and-output data signal lines D1 and D2. The gate electrodes of the transistors CH1, CH2 and EQ are coupled to an inverter circuit INV, and a precharging signal PC is supplied to the inverter circuit INV. The component transistors CH1 to CH5 and EQ are of the p-channel type. When the precharging signal PC goes up to the active high voltage level, the inverter circuit INV allows the charging transistors CH1 and CH2 and the balancing transistor EQ concurrently to turn on so that the input-and-output data signal lines D1 and D2 are precharged to the power voltage level Vdd. However, the charging transistors CH3 and CH4 are turned on at all times, and continuously supply the power voltage level Vdd to the input-and-output data signal lines D1 and D2.

The prior art dynamic random access memory device thus arranged firstly enters a resetting cycle followed by an active cycle in a usual access mode of operation. In the resetting cycle, all of the bit line pairs BLP1 to BLPn are precharged to the intermediate voltage level Vdd/2, and the precharging signal PC goes up to the active high voltage level for precharging the input-and-output data signal lines D1 and D2 through the charging transistors CH1 and CH2. Since the balancing transistor EQ turns on in the resetting cycle, the input-and-output data signal lines D1 and D2 are balanced with each other. The dynamic random access memory device, then, enters the active cycle. If the dynamic random access memory device enters the active cycle at time t1, the precharging signal is recovered to the low level as shown in FIG. 2, and the inverter circuit INV causes the transistors CH1, CH2 and EQ to turn off. Then, the input-and-output data signal lines D1 and D2 are supplied with current from the source of power voltage level Vdd through the charging transistors CH3 and CH4 only.

Assuming now that the data bit of logic "1" level stored in the memory cell Mm1 is accessed, the row address decoder unit not shown drives the word line WLj to the high level at time t2, and the switching transistors SW of the memory cells Mm1 to Mmj concurrently turn on to coupled the respective storage capacitors CP with the associated bit lines BLa. Since the memory cell Mm1 stores the data bit of logic "1" level, the bit line BLa of the bit line pair BLP1 slightly goes up, and the bit line BLb remains in the intermediate voltage level. Thus, a small difference voltage dV takes place between the bit lines BLa and BLb of the bit line pair BLP1. If the memory cell Mmj stores a data bit of logic "0" level, the bit line BLa slightly goes down as indicated by a broken line. At time t3, the activation signal SEN goes up to the high level, and, accordingly, the activation signal SEP goes down to the low level. Then, the n-channel type field effect transistor Qn3 and the p-channel type field effect transistor Qp3 turn on so that the power voltage level Vdd and the ground voltage level are supplied to the activation signal lines ACT1 and ACT2. This results in that the sense amplifier circuits SA1 to SAn are activated and increase the small difference voltages. The sense amplifier circuit SA1 increases the small difference voltage dV, and the bit lines BLa and BLb are changed toward the power voltage level Vdd and the ground voltage level. If the difference amplification is completed, the column selecting signal YS1 goes up to the high level at time t4, and the gate transistors Qt1 and Qt2 concurrently turn on. The gate transistors Qt1 and Qt2 relay the large difference voltage to the input-and-output data signal lines D1 and D2. Since the n-channel type field effect transistor Qn1 of the sense amplifier circuit SA1 is turned off, the bit line BLa and, accordingly, the input-and-output data signal line D2 are isolated from the ground node, and the input-and-output data signal line D2 remains in the power voltage level Vdd. However, a current path is established from the input-and-output data signal line D2 through the gate transistor Qt2, the n-channel type field effect transistors Qn2 and Qn3 to the ground node. The total on-resistance of the transistors Qt2, Qn2 and Qn3 is assumed to be R, and the charging transistor CH3 has the on-resistance of r. The input-and-output data signal line D1 slightly goes down to a voltage level calculated as (R)/(R+r). The voltage difference thus produced between the input-and-output data signal lines D1 and D2 is amplified by the input-and-output data buffer unit 3 and supplied form the input-and-output data buffer unit 3 to the input-and-output data terminal 4.

The prior art dynamic random access memory device shown in FIG. 1 is operative in a static column mode of operation, and the column address is sequentially changed in the static column mode of operation as shown in FIG. 3. This results in a sequential selection of the bit line pairs, and multiple selection of the column address is liable to take place in the static column mode of operation. In detail, column selecting signals YS2 and YS8 are assumed to respectively select the bit line pairs (not shown) between the leftmost and rightmost bit line pairs BLP1 and BLPn. Multiple selection of the column address takes place between time t11 and time t12, and the input-and-output data signal lines D1 and D2 sometimes trace plots A and A'. As described hereinbefore, the input-and-output data signal lines D1 and D2 are charged through the charging transistors CH3 and CH4 at all times. If most of the data bits simultaneously selected are identical in logic level with one another, the data bits cause one of the input-and-output data signal lines D1 and D2 to go down near the ground voltage level, because a plurality of current paths are established from the aforesaid one of the input-and-output data signal lines through the associated sense amplifier circuits to the ground node. The extremely low voltage level Vss near the ground level is propagated from the input-and-output data signal line to all of the bit lines coupled thereto and tends to pull down the voltage level on the bit lines. If one of the bit lines is opposite in voltage level to the other bit lines, the data bit on the aforesaid one of the bit lines is much liable to be destroyed with the extremely low voltage level Vss. Thus, one of the problems encountered in the prior art dynamic random access memory device is destruction of the data bit upon the multiple selection in the static column mode of operation.

Another problem inherent in the prior art dynamic random access memory device is slow recovery from the extremely low voltage level Vss. Even though the extremely low voltage level Vss does not destroy the data bit of the opposite logic level, the recovery from the extremely low voltage level Vss consumes a long time period upon selecting a bit line pair with a data bit opposite in logic level. If the bit line pair selected after the multiple selection is opposite in logic level to the data bits in the multiple selection, the charging transistor CH3 to CH4 needs to charge the input-and-output data signal line, but is constant in current driving capability, because the charging transistor CH3 or CH4 is operative in the saturated region with the constant voltage level, i.e. the ground voltage level, at the gate electrode thereof. Such a constant current driving capability consumes a relatively long time period for recovery from the extremely low voltage level, and time delay is introduced in the propagation of the next data bit.

SUMMARY OF THE INVENTION

It is therefore an important object of the present invention to provide a dynamic random access memory device which is less liable to destroy a data bit upon multiple selection of bit line pairs.

To accomplish these objects, the present invention proposes to prevent an input-and-output data signal line from an extremely low voltage level upon the multiple selection.

In accordance with the present invention, there is provided a dynamic random access memory device having a static column mode of operation, comprising: a) a plurality of memory cells arranged in rows and columns and storing data bits, respectively; b) a plurality of bit lines respectively coupled to the columns of the memory cells for propagating the data bits read out from the memory cells, every two bit lines being paired with one another so as to form bit line pairs; c) a plurality of word lines respectively coupled to the rows of the memory cells and allowing the data bits stored in one of the rows of the memory cells to be read out to the bit line pairs, one of the bit lines of each bit line pair propagating the data bit read out from the memory cell therethrough; d) a plurality of sense amplifier circuits provided in association with the bit line pairs, each of the sense amplifier circuits selectively coupling the bit lines of the associated bit line pair to first and second sources of voltage level depending upon the logic level of the data bit on the associated bit line pair; e) a pair of data signal lines coupled to an output data buffer circuit; f) a column selector unit coupled between the bit line pairs and the data signal lines and sequentially interconnecting the bit line pairs and the data signal lines in the static column mode of operation; and g) a precharging unit coupled to the data signal lines and having current paths from the first source of voltage level to the data signal lines and a limiter coupled between the first source of voltage level and the data signal lines for prohibiting the data signal lines from an excess variation in voltage level.

BRIEF DESCRIPTION OF THE DRAWINGS

The features and advantages of a dynamic random access memory device according to the present invention will be more clearly understood from the following description taken in conjunction with the accompanying drawings in which.

DESCRIPTION OF THE PREFERRED EMBODIMENTS

First Embodiment

Figure 4:
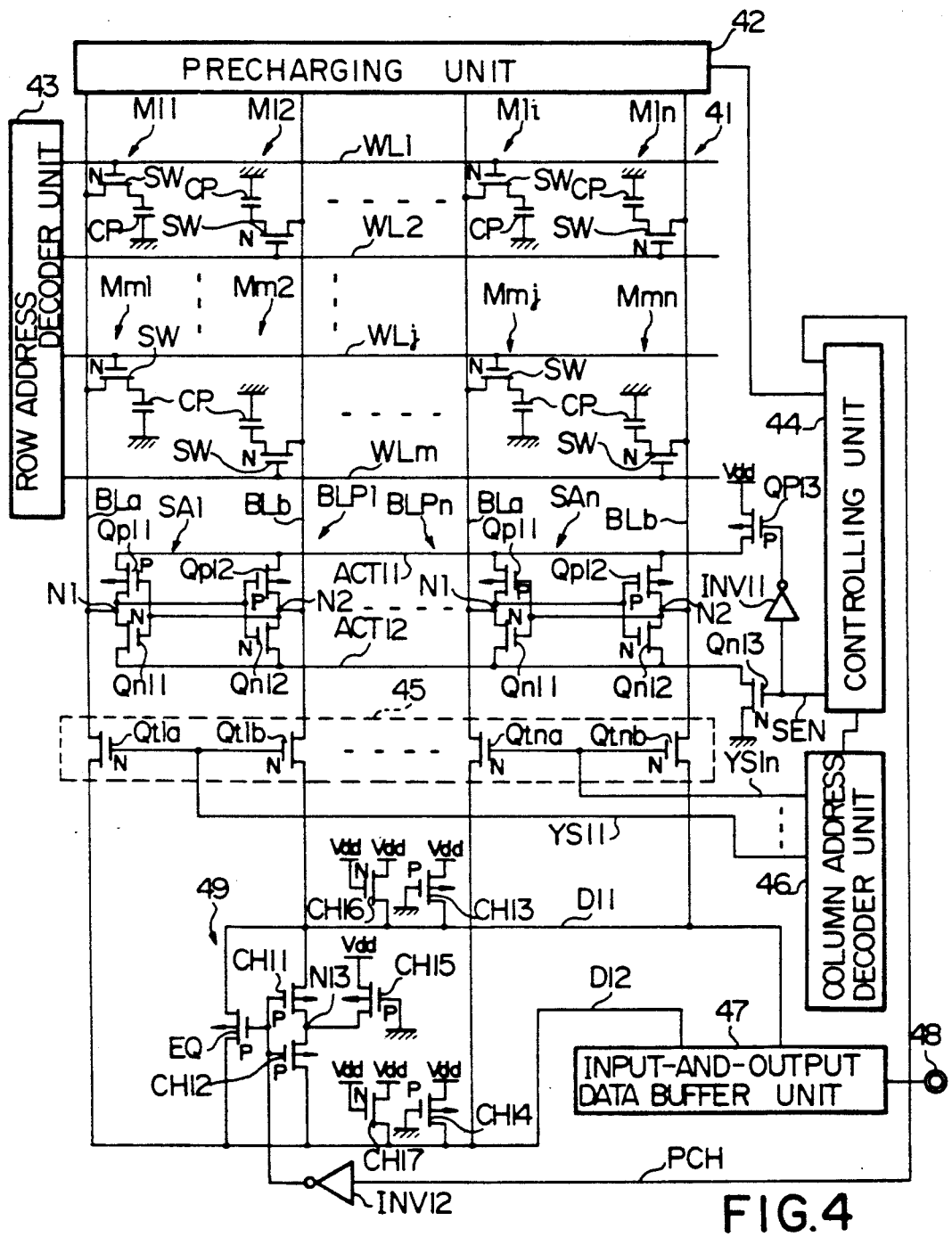
FIG. 4 is a circuit diagram showing the arrangement of a dynamic random access memory device according to the present invention.

Referring to FIG. 4 of the drawings, a dynamic random access memory device embodying the present invention comprises a memory cell array 41 having a plurality of memory cells M11, M12, M1i, M1n, Mm1, Mm2, Mmi and Mmn arranged in rows and columns. The memory cell array 41 is associated with bit line pairs BLP1 to BLPn, and each of the bit line pairs BLP1 to BLPn is constituted by two bit lines BLa and BLb. The bit lines BLa and BLb are respectively provided for the columns of the memory cells M11 to Mmn, and each of the memory cells M11 to Mmn is implemented by a series combination of a switching transistor SW and a storage capacitor CP coupled between the associated bit line BLa or BLb and a ground node. The switching transistors SW are of the n-channel type. A precharging unit 42 is coupled to the bit line pairs BLP1 to BLPn and precharges the bit line pairs BLP1 to BLPn to an intermediate voltage level Vdd/2 between the power voltage level Vdd and the ground voltage level.

The memory cell array 41 is further associated with a plurality of word lines WL1, WL2, WLj and WLm, and the switching transistors SW of the rows are respectively coupled at the gate electrodes thereof to the word lines WL1 to WLm. A row address decoder unit 43 is responsive to a row address signal and selectively drives the word lines WL1 to WLm.

The bit line pairs BLP1 to BLPn are respectively coupled to sense amplifier circuits SA1 to SAn, and each of the sense amplifier circuits SA1 to SAn comprises two series combinations of p-channel type field effect transistors Qp11 and Qp12 and n-channel type field effect transistors Qn11 and Qn12 coupled in parallel between two activation signal lines ACT11 and ACT12. A coupled of sense nodes N1 and N2 are provided between the p-channel type field effect transistors Qp11 and Qp12 and the n-channel type field effect transistors Qn11 and Qn12, respectively, and the sense nodes N1 and N2 are coupled to not only the bit lines BLa and BLb of the associated bit line pair but also the gate electrodes of the opposite field effect transistors Qp12 and Qn12, and Qp11 and Qn11. The activation signal lines ACT11 and ACT12 are respectively coupled through a p-channel type field effect transistor Qp13 and an n-channel type field effect transistor Qn13 to a source of power voltage level Vdd and the ground node, and the p-channel type field effect transistor Qp3 and the n-channel type field effect transistor Qn3 concurrently turn on and off with activation signal SEN and the complementary signal thereof produced by an inverter circuits INV11. The activation signal SEN is shifted between active high and inactive low voltage levels and allows the n-channel type field effect transistor Qn13 and the p-channel type field effect transistor Qp13 to concurrently turn on and off. When the p-channel type field effect transistors Qp13 and the n-channel type field effect transistor Qn13 turn on, the power voltage level Vdd and the ground voltage level are respectively supplied to the activation signal lines ACT1 and ACT2, and the sense amplifier circuits SA1 to SAn concurrently start the difference amplifications. The activation signal SEN is supplied from a controlling unit 44, and the controlling unit 44 further produces various controlling signals as described hereinbelow.

The bit line pairs BLP1 to BLPn are further coupled to a column selector unit 45 consisting of gate transistors Qt1a, Qt1b, Qtna and Qtnb, and the gate transistors Qt1a to Qtnb are of the n-channel type. A column address decoder unit 46 is responsive to a column address signal, and one of the column selecting signals YS11 to YS1n is driven to the active high level in a usual access mode of operation. Namely, a couple of the gate transistors Qt1a and Qtib or Qtna and Qtnb turn on in the presence of a column selecting signal YS11 or YS1n of the active high level and allow the associated bit line pair to a pair of input-and-output data signal lines D11 and D12. However, if the dynamic random access memory device enters a static column mode of operation, the column address decoder unit 46 sequentially supplies the column selecting signals YS11 to YS1n, and the bit line pairs BLP1 to BLPn are sequentially coupled to the input-and-output data signal lines D1 and D2. The input-and-output data signal lines D11 and D12 are coupled to an input-and-output data buffer unit 47, and the input-and-output data buffer unit 47 drives an input-and-output data terminal 48.

A precharging circuit 49 is associated with the input-and-output data signal lines D11 and D12, and comprises a series combination of switching transistors CH11 and CH12 coupled between the input-and-output data signal lines D11 and D12, a pair of charging transistors CH13 and CH14 coupled between the source of power voltage level Vdd and the respective input-and-output data signal lines D11 and D12, a charging transistor CH15 coupled between the source of power voltage level Vdd and an intermediate node N13 of the switching transistors CH11 and CH12, and a balancing transistor EQ coupled between the input-and-output data signal lines D11 and D12. The gate electrodes of the transistors CH11, CH12 and EQ are coupled to an inverter circuit INV12, and a precharging signal PCH of the active high voltage level is supplied from the controlling unit 44 to the inverter circuit INV12. The component transistors CH11 to CH15 and EQ are of the p-channel type. When the precharging signal PCH goes up to the active high voltage level, the inverter circuit INV12 allows the charging transistors CH111 and CH12 and the balancing transistor EQ concurrently to turn on so that the input-and-output data signal lines D11 and D12 are precharged to the power voltage level Vdd. However, the charging transistors CH13 and CH14 are turned on at all times, and continuously supply the power voltage level Vdd to the input-and-output data signal lines D11 and D12. The precharging circuit 49 further comprises a limiter, and the limiter is fabricated from two n-channel type field effect transistors CH16 and CH17 coupled between the source of positive voltage level Vdd and the respective input-and-output data signal lines D11 and D12. Since the gate electrodes of the n-channel type field effect transistors CH16 and CH17 are coupled to the source of power voltage level Vdd, the n-channel type field effect transistors CH16 and CH17 serve as diodes. When one of the input-and-output data signal lines D11 and D12 is decayed below a predetermined voltage level Vpd lower than the power voltage level Vdd by the threshold voltage level Vtn of the n-channel type field effect transistors CH16 and CH17, the associated n-channel type field effect transistor CH16 or CH17 turns on to pull up the input-and-output data signal line D11 or D12, and, for this reason, the input-and-output data signal lines never reach an extremely low voltage level near the ground voltage level. The current driving capability of the n-channel type field effect transistor CH16 or CH17 is increased together with increment of the difference voltage between the power voltage level Vdd and the input-and-output data signal line D11 or D12 and is proportional to $((Vdd-Vin)-Vtn)^2$ where Vin is the voltage level on either input-and-output data signal line D11 or D12.

Figure 1:
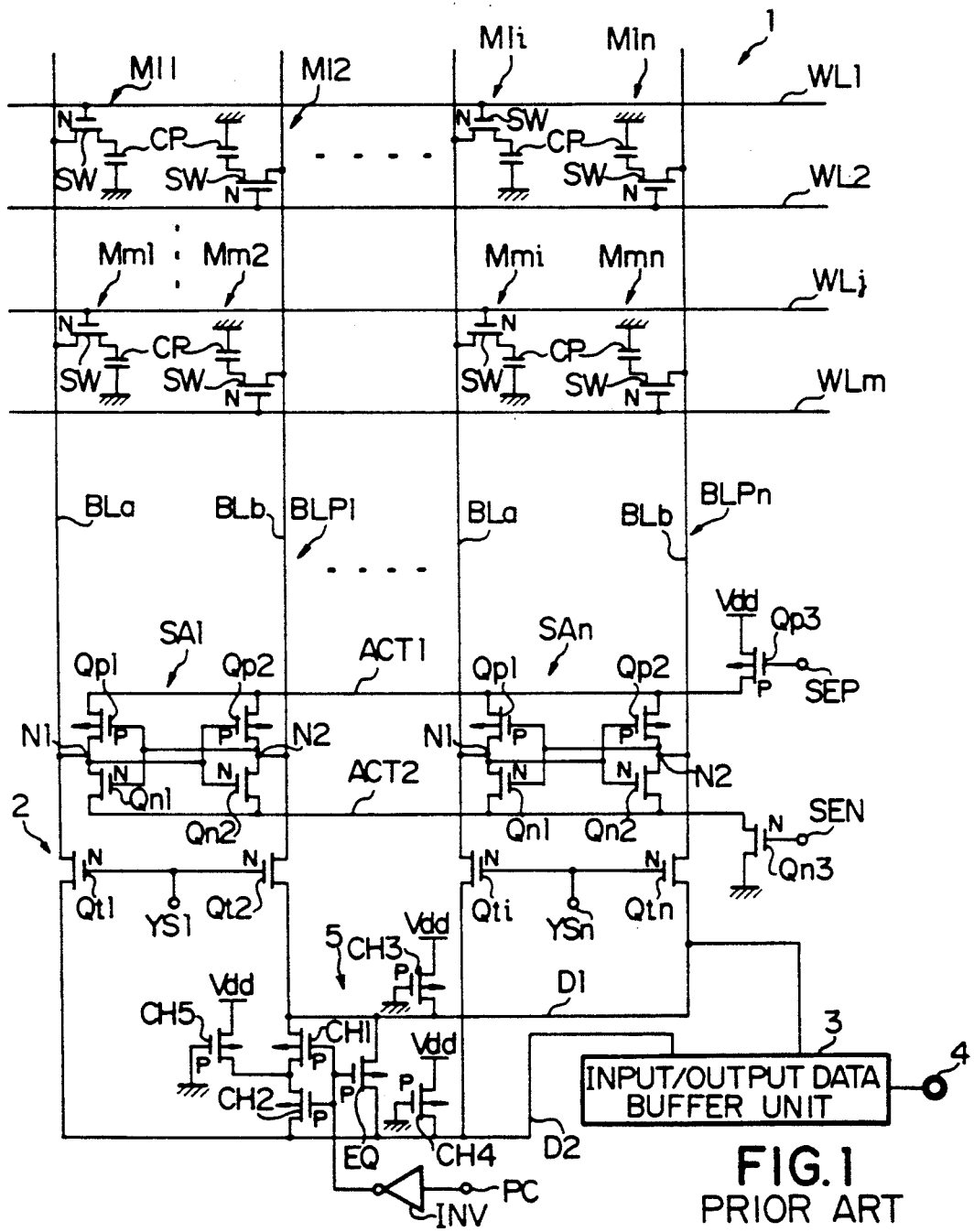
FIG. 1 is a block diagram showing the arrangement of a prior art dynamic random access memory device.
Figure 2:
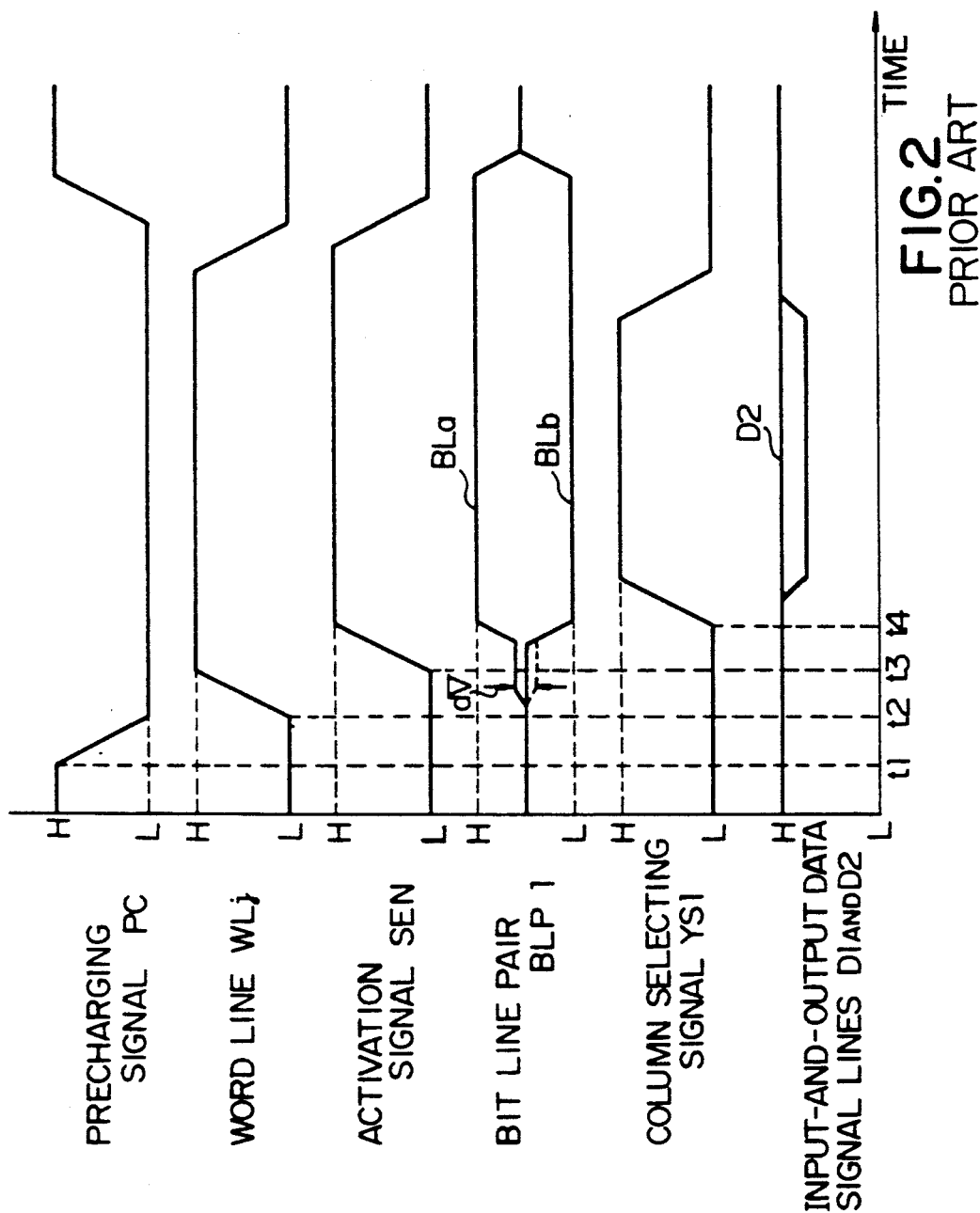
FIG. 2 is a diagram showing the waveforms of essential signals of the prior art dynamic random access memory device in a usual access mode of operation.
Figure 3:
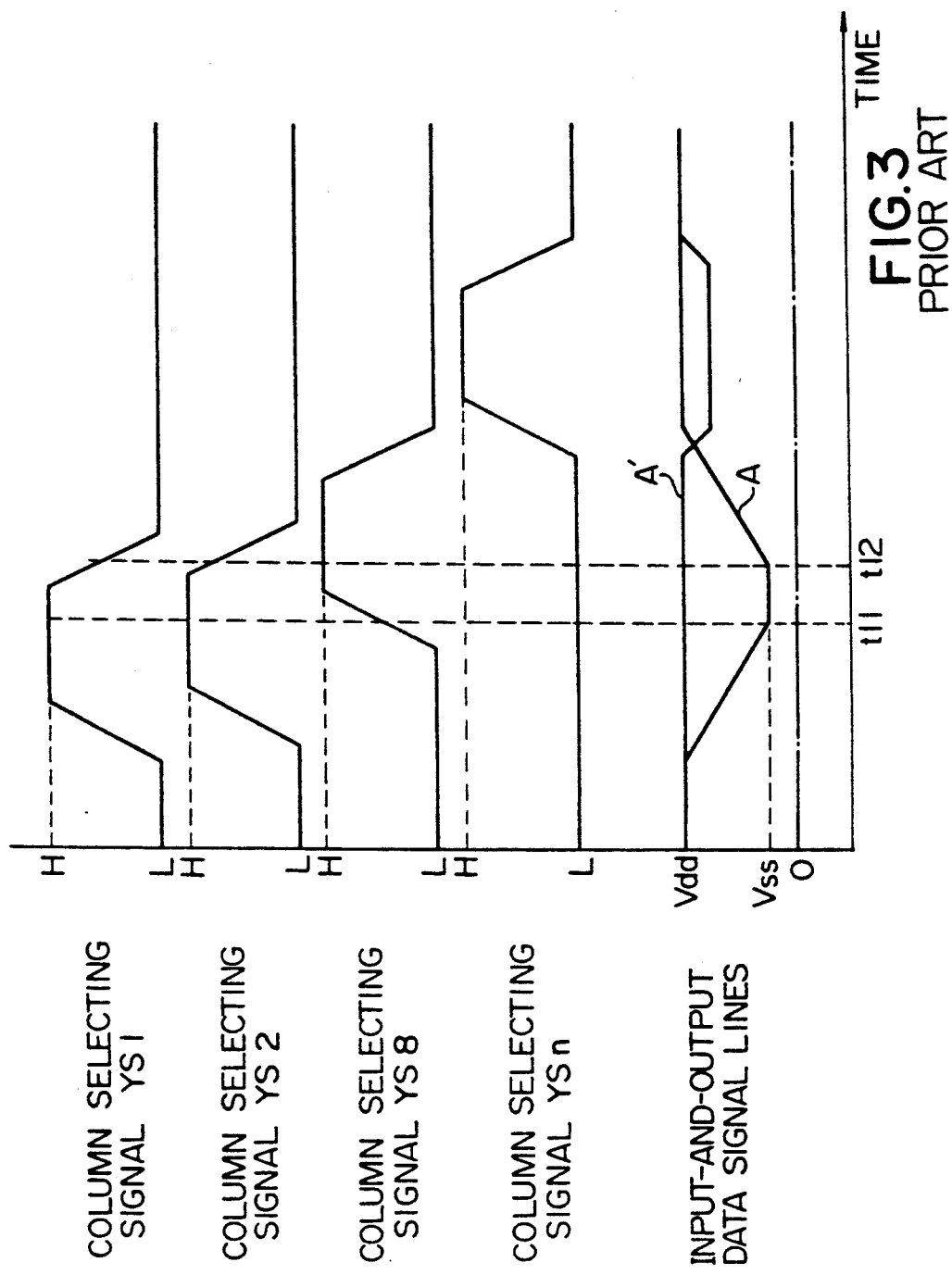
FIG. 3 is a diagram showing the waveforms of essential signals of the prior art dynamic random access memory device in a static column mode of operation.

When the dynamic random access memory device enters the usual access mode of operation, the circuit behavior is similar to that described with reference to FIG. 2, and no description is made on the usual access mode of operation for avoiding repetition.

In the static column mode of operation, the dynamic random access memory device behaves as follows. In the initial stage of the static column mode of operation, a resetting cycle is carried out, and the bit line pairs BLP1 to BLPn are precharged to the intermediate voltage level Vdd/2. Since the precharging signal PCH goes up to the active high voltage level Vdd, the input-and-output data signal lines D11 and D12 are also precharged through the charging transistors CH13 to CH15 as well as the switching transistors CH11 and CH12, and the input-and-output data signal lines D11 and D12 reach the power voltage level. The row address decoder 43, by way of example, drives the word lines WLj, and the switching transistors SW coupled thereto concurrently turn on so that data bits are read out from the memory cells Mm1 to Mmj to the bit lines BLa of the associated bit line pairs BLP1 to BLPn. The activation signal SEN goes up to the active high level, and the n-channel type field effect transistor Qn13 and the p-channel type field effect transistor Qp13 turn on to couple the activation lines ACT11 and ACT12 to the source of power voltage level Vdd and the ground node, respectively. In the static column mode of operation, the column address signal is sequentially changed so that column address decoder unit 46 also sequentially shifts the column selecting signals YS11 to YS1n to the active high level.

Figure 5:
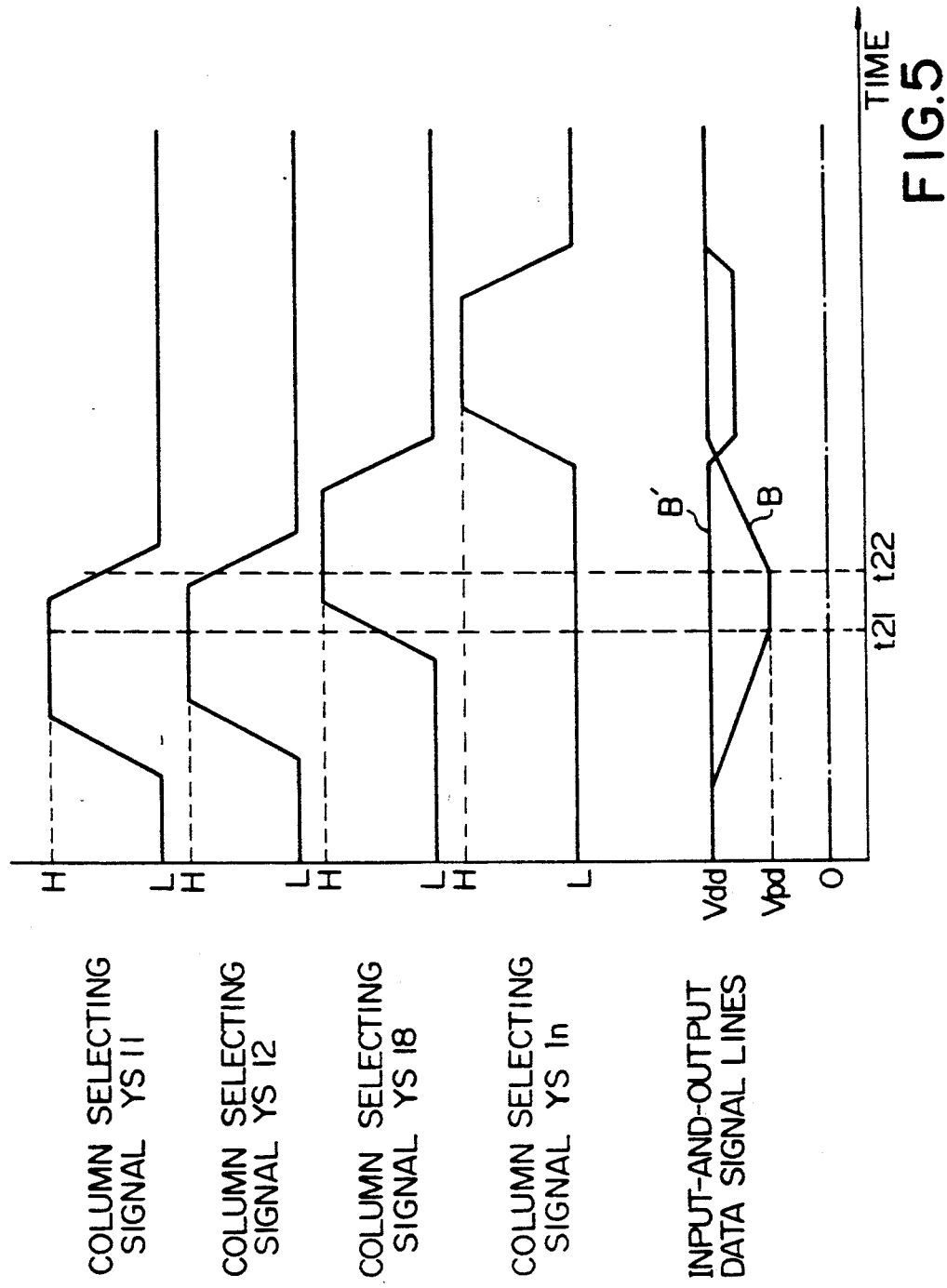
FIG. 5 is a diagram showing the waveforms of essential signals of the dynamic random access memory device shown in FIG. 4 in a static column mode of operation.

FIG. 5 shows the column selecting signals YS11, YS12, YS18 and YS1n sequentially shifted to the active high level, and multiple selecting takes place between time t21 to t22. If most of the data bits on the bit line pairs BLP1 to BLPn are logic "1" level, the input-and-output data signal line D12 remains in the power voltage level as indicated by plots B'. However, the other input-and-output data signal line D11 goes down toward the ground voltage level as indicated by plots B. The charging transistor CH3 continuously supplies current to the input-and-output data signal line D11, however, the current driving capability of the charging transistor CH13 is too short to keep the voltage level on the input-and-output data signal line D11 as described hereinbefore. When the input-and-output data signal line reaches the predetermined voltage level Vpd lower than the power voltage level Vdd by the threshold voltage Vtn of the n-channel type field effect transistor CH16, the limiter or the n-channel type field effect transistor CH16 turns on so that the input-and-output data signal line D11 never goes down below the predetermined voltage level Vpd. Thus, the input-and-output data signal line D11 remains in a predetermined narrow voltage range upon the multiple selection, and, for this reason, any undesirable destruction of data bit never takes place. Moreover, the input-and-output data signal line D11 can be rapidly recovered from the predetermined voltage level Vpd, and no time delay is introduced to the next data propagation through the input-and-output data signal lines D11 and D12. By virtue of the limiter, if the power voltage level Vdd is about 5 volts, the maximum voltage decay is of the order of 2 volts. However, the maximum voltage decay is as large as 4 volts without the limiter, and the limiter is surely effective against the destruction of data bit and a slow recovery of the input-and-output data signal line.

Second Embodiment

Figure 6:
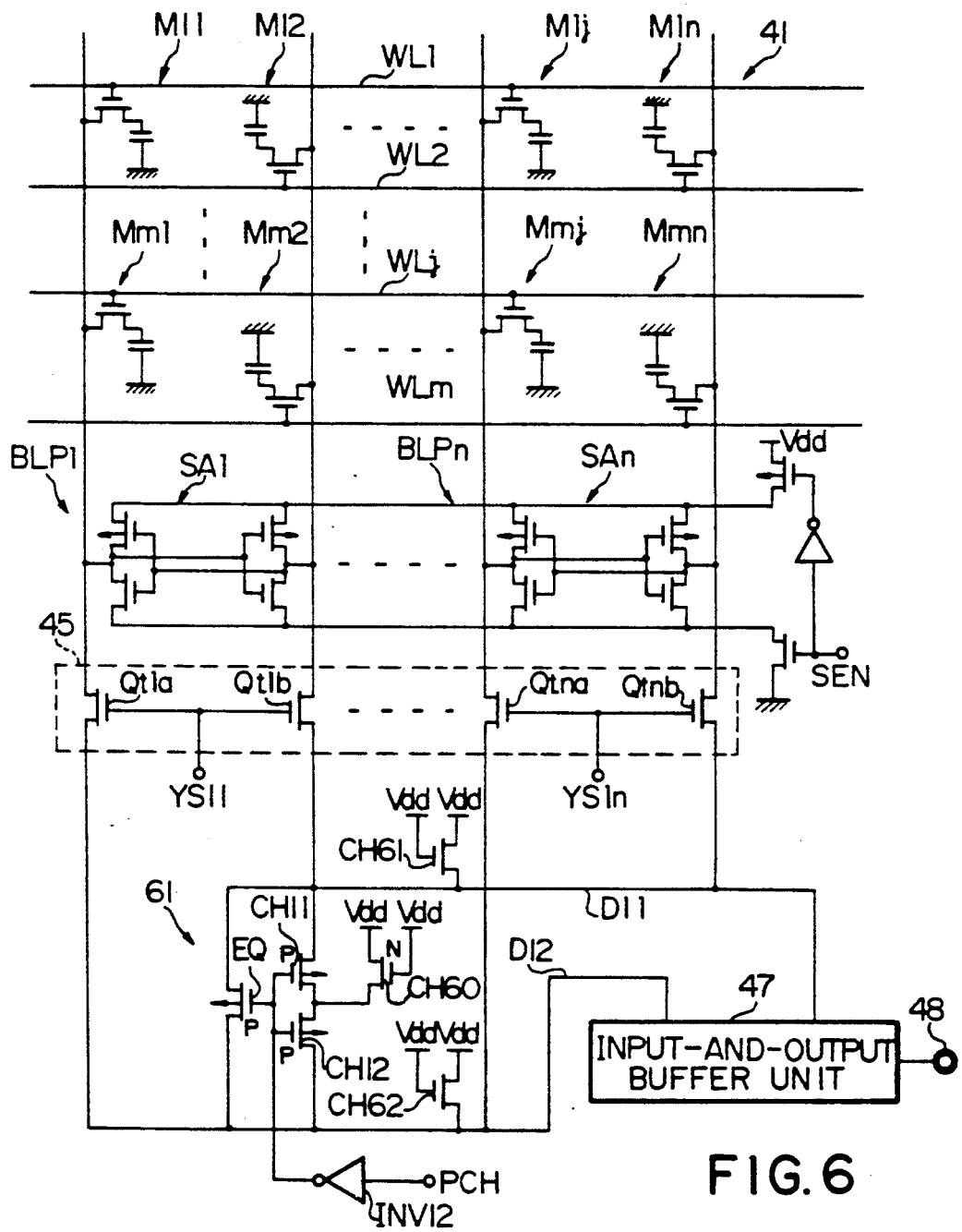
FIG. 6 is a circuit diagram showing the arrangement of another dynamic random access memory device according to the present invention.

Turning to FIG. 6 of the drawings, another dynamic random access memory device embodying the present invention is illustrated. The dynamic random access memory device shown in FIG. 6 is similar in circuit arrangement to the first embodiment except for a precharging circuit 61 coupled to the input-and-output data signal lines D11 and D12, and description is hereinbelow focused upon the precharging circuit only. The other circuit components are designated by the sam reference numerals and marks without any detailed description.

Figure 7:
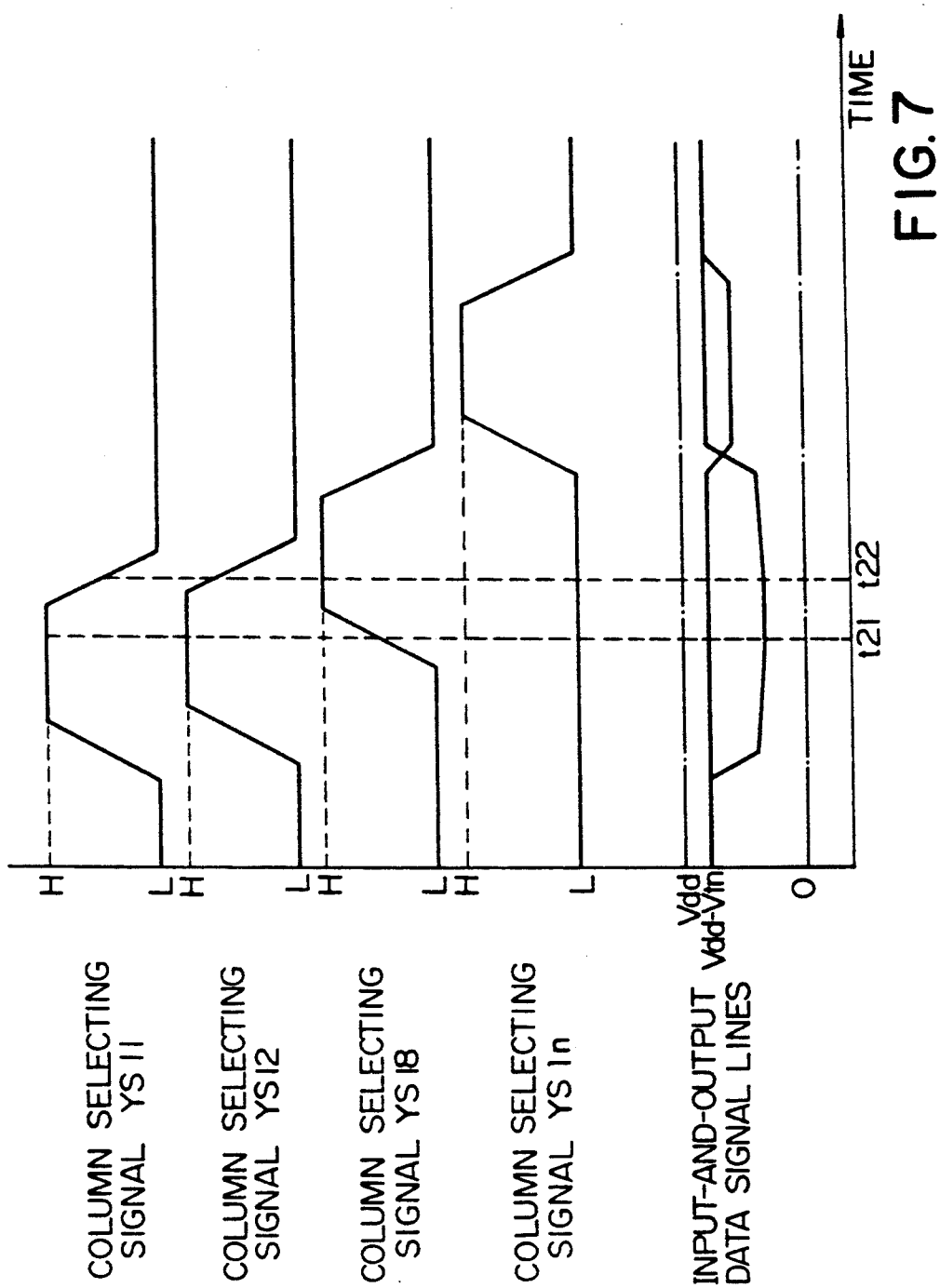
FIG. 7 is a diagram showing the waveforms of essential signals of the dynamic random access memory device shown in FIG. 6 in a static column mode of operation.

The precharging circuit 61 comprises the switching transistors CH11 and CH12 of the p-channel type, a charging transistor CH15 of the n-channel type, the balancing transistor EQ of the p-channel type, and a limiter implemented by two n-channel type field effect transistors Ch61 and CH62. Thus, charging transistors CH60 to Ch62 of the n-channel type charge the inputand-output data signal lines D11 and D12, and, for this reason, the input-and-output data signal lines D11 and D12 do not exceed a slightly lower voltage level (Vdd-Vtn) than the power voltage level as will be seen from FIG. 7. Namely, the input-and-output data signal lines D11 and D12 are precharged through the charging transistors CH60 to CH62 in a resetting cycle, and the charging transistors CH61 and CH62 continuously supply current to the input-and-output data signal lines D11 and D12 in an active cycle. Since the current driving capability of the n-channel type charging transistor CH60, CH61 or CH62 is proportional to $((Vdd-Vin)-Vtn)^2$, the input-and-output data signal lines D11 and D12 are rapidly charged to the voltage level (Vdd−Vtn), and the n-channel type charging transistors are substantially turned off after reaching the voltage level (Vdd−Vtn). The current driving capability of the n-channel type charging transistor CH60, CH61 or CH62 is as small as 1 micro-ampere. In this situation, if one of the input-and-output data signal lines D11 and D12 is decayed, the n-channel type charging transistor coupled to the other data signal line is kept in the high-impedance state, and the other n-channel type charging transistor drives the aforesaid one of the input-and-output data signal lines with a large current driving capability. By virtue of the n-channel type charging transistors CH61 and CH62, the input-and-output data signal lines D11 and D12 hardly go down below a predetermined voltage level.

Although particular embodiments of the present invention have been shown and described, it will be obvious to those skilled in the art that various changes and modifications may be made without departing from the spirit and scope of the present invention.

What is claimed is:

1. A dynamic random access memory device having a static column mode of operation, comprising:
   a) a plurality of memory cells arranged in rows and columns and storing data bits, respectively;
   b) a plurality of bit lines respectively coupled to said columns of said memory cells for propagating said data bits read out from said memory cells, every two bit lines being paired with one another so as to form bit line pairs;
   c) a plurality of word lines respectively coupled to said rows of said memory cells and allowing said data bits stored in one of said rows of said memory cells to be read out to said bit line pairs, one of said bit lines of each bit line pair propagating said data bit read out from said memory cell therethrough;
   d) a plurality of sense amplifier circuits provided in association with said bit line pairs, each of said sense amplifier circuits selectively coupling the bit lines of said associated bit line pair to first and second sources of voltage level depending upon the logic level of said data bit on said associated bit line pair, said first and second sources of voltage level supplying a positive power voltage level and a ground voltage level, respectively;
   e) a pair of data signal lines coupled to an output data buffer circuit;
   f) a column selector unit coupled between said bit line pairs and said data signal lines and sequentially transferring data bits from said bit line pairs to said data signal lines in said static column mode of operation after one of said word lines allows said data bits to be read out from one of said rows of said memory cells to said bit line pairs; and
   g) a precharging unit coupled to said data signal lines and having current paths from said first source of voltage level to said data signal lines, and a limiter implemented by first and second field effect transistors having respective gate electrodes coupled with said first source of voltage level and coupled between said first source of voltage level and said data signal lines for prohibiting said data signal lines from an excess variation in voltage level when said column selector unit simultaneously couples more than one bit line pair selected from said bit line pairs with said pair of data signal lines in said static column mode of operation, which prevents data bits on said bit line pairs from a change in logic level.

2. A dynamic random access memory device as set forth in claim 1, in which said limiter increased the current driving capability thereof together with a difference in voltage level between said first source of voltage level and one of said data signal lines.

3. A dynamic random access memory device as set forth in claim 2, in which said current paths are established through third and fourth p-channel type field effect transistors coupled between said first source of voltage level and said respective data signal lines, said third and fourth p-channel type field effect transistors having respective gate electrodes coupled to said second source of voltage level, and in which said precharging unit further comprises a fifth and sixth p-channel type field effect transistors having respective gate electrodes supplied with a precharging signal and coupled between said data signal lines, and a seventh p-channel type field effect transistor with a gate electrode coupled to said second source of voltage level and interconnecting said first source of voltage level and an intermediate node of said fifth and sixth p-channel type field effect transistors.

4. A dynamic random access memory device as set forth in claim 3, in which said precharging unit further comprises a p-channel type balancing transistor coupled between said data signal lines and having gate electrode supplied with said precharging signal.

5. A dynamic random access memory device as set forth in claim 2, in which said precharging unit comprises an eighth and ninth p-channel type field effect transistors having respective gate electrodes supplied with a precharging signal and coupled between said data signal lines, a tenth n-channel type field effect transistor with a gate electrode coupled to said first source of voltage level and interconnecting said first source of voltage level and an intermediate node of said eighth and ninth p-channel type field effect transistors, and an eleventh p-channel type field effect transistor coupled between said data signal lines and having a gate electrode supplied with said precharging signal, said current path being established from said tenth n-channel type field effect transistor through said eighth and ninth p-channel type field effect transistors to said data signal lines.

* * * * *

UNITED STATES PATENT AND TRADEMARK OFFICE
CERTIFICATE OF CORRECTION

PATENT NO.   : 5,295,099
DATED        : Mar. 15, 1994
INVENTOR(S)  : Akihiko KAGAMI It is certified that error(s) appears in the above-identified patent and that said Letters Patent is hereby corrected as shown below:

Col. 3, line 49, delete "form" and insert --from--.

Col. 6, line 22, delete "Qp3" and insert --Qp13--.

Col. 6, line 23, delete "Qn3" and insert --Qn13--.

Col. 7, line 15, delete "CH111" and insert --CH11--.

Col. 8, line 22, delete "CH3" and insert --CH13--.

Col. 8, line 59, delete "sam" and insert --same--.

UNITED STATES PATENT AND TRADEMARK OFFICE
CERTIFICATE OF CORRECTION

PATENT NO.   : 5,295,099
DATED        : Mar. 15, 1994
INVENTOR(S)  : Akihiko KAGAMI It is certified that error(s) appears in the above-identified patent and that said Letters Patent is hereby corrected as shown below:

Col. 8, line 67, delete "Ch61" and insert --CH61--.

Col. 8, line 68, delete "Ch62" and insert --CH62--.

Signed and Sealed this

Fourteenth Day of February, 1995

*Attest:*

BRUCE LEHMAN

*Attesting Officer*    *Commissioner of Patents and Trademarks*